United States Patent
Brunolli et al.

(10) Patent No.: US 10,613,613 B2
(45) Date of Patent: Apr. 7, 2020

(54) MEMORY INTERFACE WITH ADJUSTABLE VOLTAGE AND TERMINATION AND METHODS OF USE

(71) Applicant: QUALCOMM Incorporated, San Diego, CA (US)

(72) Inventors: Michael Brunolli, Escondido, CA (US); Stephen Thilenius, San Diego, CA (US); Patrick Isakanian, El Dorado Hills, CA (US); Vaishnav Srinivas, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/863,155

(22) Filed: Jan. 5, 2018

(65) Prior Publication Data

US 2018/0129267 A1    May 10, 2018

Related U.S. Application Data

(62) Division of application No. 14/863,890, filed on Sep. 24, 2015, now Pat. No. 9,910,482.

(51) Int. Cl.
*H03K 19/0175* (2006.01)
*G06F 1/3234* (2019.01)
(Continued)

(52) U.S. Cl.
CPC .............. *G06F 1/3275* (2013.01); *G06F 1/32* (2013.01); *G06F 1/3209* (2013.01);
(Continued)

(58) Field of Classification Search
CPC .................................................. G11C 7/1507
(Continued)

(56) References Cited

U.S. PATENT DOCUMENTS 6,885,226 B2    4/2005    Waldrop
7,764,082 B2    7/2010    Yan et al.
(Continued)

FOREIGN PATENT DOCUMENTS

JP    H1020974 A    1/1998
JP    2003133943 A    5/2003
(Continued)

OTHER PUBLICATIONS

International Search Report and Written Opinion—PCT/US2016/051134—ISA/EPO—dated Dec. 15, 2016.
(Continued)

*Primary Examiner* — Min Huang
(74) *Attorney, Agent, or Firm* — Haynes and Boone, LLP

(57) ABSTRACT

A memory interface includes: a pull-up device and a pull-down device, wherein the pull-up device couples between a power rail and a data line, and wherein the pull-down device couples between the data line and ground; and a power supply configured to supply a first power supply voltage to the power rail during a terminated data transmission mode in which a receiving memory interface coupled to the data line has an active on-die termination, and wherein the power supply is further configured to supply a second power supply voltage to the power rail during an unterminated data transmission mode in which the on-die termination does not load the data line, the second power supply voltage being less than the first power supply voltage.

20 Claims, 4 Drawing Sheets

(51) Int. Cl.
    *G11C 7/10*             (2006.01)
    *G11C 11/4074*      (2006.01)
    *G06F 1/3287*       (2019.01)
    *G06F 13/16*        (2006.01)
    *G06F 13/40*        (2006.01)
    *G06F 13/42*        (2006.01)
    *G06F 1/32*         (2019.01)
    *H04L 25/02*        (2006.01)
    *G06F 1/3209*       (2019.01)
    *G06F 1/3296*       (2019.01)

(52) U.S. Cl.
    CPC .......... *G06F 1/3287* (2013.01); *G06F 1/3296* (2013.01); *G06F 13/16* (2013.01); *G06F 13/4086* (2013.01); *G06F 13/4243* (2013.01); *G11C 7/1072* (2013.01); *G11C 11/4074* (2013.01); *H04L 25/0264* (2013.01); *H04L 25/0278* (2013.01); *Y02D 10/14* (2018.01); *Y02D 10/172* (2018.01); *Y02D 50/20* (2018.01)

(58) Field of Classification Search
    USPC .......................................................... 326/30
    See application file for complete search history.

(56) References Cited

U.S. PATENT DOCUMENTS

| | | | |
|---|---|---|---|
| 7,864,183 B1 | 1/2011 | Lam et al. | |
| 8,004,311 B2 | 8/2011 | Kim et al. | |
| 8,537,905 B2 * | 9/2013 | Khoury | H04L 25/0272 307/130 |
| 9,046,909 B2 | 6/2015 | Leibowitz et al. | |
| 9,513,655 B1 | 12/2016 | Liu et al. | |
| 9,537,676 B2 * | 1/2017 | Koo | H03K 5/084 |
| 9,910,482 B2 * | 3/2018 | Brunolli | H04L 25/0278 |
| 2004/0100837 A1 | 5/2004 | Lee | |
| 2007/0080707 A1 | 4/2007 | Brinkman et al. | |
| 2007/0139071 A1 | 6/2007 | Nguyen | |
| 2009/0267637 A1 | 10/2009 | Park | |
| 2010/0237903 A1 | 9/2010 | Nguyen | |
| 2011/0001463 A1 | 1/2011 | Jang et al. | |
| 2014/0253173 A1 * | 9/2014 | Chun | G06F 13/4086 326/30 |
| 2014/0253208 A1 * | 9/2014 | Ruberg | H04L 25/028 327/331 |
| 2014/0300371 A1 | 10/2014 | Pickerd et al. | |
| 2015/0002408 A1 | 1/2015 | Mozak et al. | |
| 2015/0023112 A1 | 1/2015 | Eom et al. | |
| 2015/0113214 A1 * | 4/2015 | Sutardja | G06F 12/0868 711/106 |
| 2016/0162214 A1 * | 6/2016 | McCall | H03K 19/018585 711/154 |
| 2017/0067954 A1 * | 3/2017 | Kim | H01L 27/0207 |
| 2017/0090546 A1 | 3/2017 | Brunolli et al. | |

FOREIGN PATENT DOCUMENTS

| | | |
|---|---|---|
| JP | 2004310981 A | 11/2004 |
| JP | 2009529282 A | 8/2009 |
| JP | 2010529759 A | 8/2010 |
| JP | 2010219751 A | 9/2010 |
| JP | 2011176816 A | 9/2011 |
| JP | 2013065086 A | 4/2013 |
| JP | 2013534014 A | 8/2013 |
| JP | 2014241057 A | 12/2014 |
| KR | 20150047635 A | 5/2015 |

OTHER PUBLICATIONS

European Search Report—EP19203349—Search Authority—Munich—dated Dec. 2, 2019.

* cited by examiner

MEMORY INTERFACE WITH ADJUSTABLE VOLTAGE AND TERMINATION AND METHODS OF USE

CROSS-REFERENCE TO RELATED APPLICATION

This application is a divisional of U.S. application Ser. No. 14/863,890, filed on Sep. 24, 2015, the entire disclosure of which is hereby incorporated by reference in its entirety.

TECHNICAL FIELD

This application relates to memory interfaces with processor devices, and more particularly, to memory interfaces having an adjustable voltage and termination.

BACKGROUND

Synchronous dynamic random-access memory (SDRAM) is one class of memory used in mobile communication and computing devices, such as smart phones and tablet computers. In some embodiments, double data rate SDRAM (DDR SDRAM or DDR) refers to a type of memory and an associated interface for communicating with the memory. Furthermore, low power DDR (LPDDR or simply LP), sometimes referred to as mobile DDR, is a class of DDR designed to reduce power consumption, with mobile devices being a target application. There are several versions of LPDDR corresponding to various data speeds and power requirements. For example, LPDDR3 (also sometimes denoted as LP3) and LPDDR4 (also sometimes denoted as LP4) are two recent versions of LPDDR. LPDDR4 is designed to communicate at a higher speed and consume less power than LPDDR3 at the expense of increased cost and/or complexity.

A trend in modern mobile devices, such as smartphones, is to focus memory designs on ever greater memory transfer rate while at the same time conserving power. A system on chip (SoC) is often used in mobile devices to conserve power and/or minimize space requirements. A SoC refers to multiple functional blocks, such as modems and application processor cores, embedded on a single substrate, allowing mobile devices to execute complex and power intensive applications. The single substrate is sometimes referred to as a die, so multiple functional blocks are commonly implemented on a single die.

The current generation of low power double data rate (LPDDR4) DRAM uses n-type Field Effect Transistors (NFETs) for both the pull-up and pull-down driver in its interface. In addition, an on-die termination (ODT) device (such as a transistor) may be switched on when receiving data to present a desired impedance to a receive line. This is commonly referred to as the terminated mode. The pull-up and pull-down transistors are tuned to also present the desired impedance (e.g., 50 Ohms) when they are switched on during data transmission.

The power supply voltage (VDDQ) for a conventional LPDDR4 interface is typically around 1.1V. In a terminated high-speed mode of operation in which the ODT transistor is active in the receiving node, the pull-up transistor in the transmitting device and the ODT transistor in the receiving device effectively form a voltage divider that divides the source voltage for the pull-up transistor by one-half. The source voltage for the pull-up transistor when active is VDDQ minus its threshold voltage such that the source voltage varies between a minimum of 550 mV to a maximum of 888 mV (the average being around 720 mV). Due to the voltage divider formed as just discussed, the receiving device will thus receive a voltage of approximately 350 mV on average when the pull-up device is active. When the pull-down device is active, the received voltage is ground such that the voltage swing at the receiving node for the terminated high-speed mode is approximately 350 mV.

But the active ODT device in the terminated mode consumes DC power. Thus, if the current data transmission does not require the bandwidth of the terminated high-speed mode, an unterminated reduced speed mode may be used. In the unterminated mode, the ODT device is switched off. Since the receiving device has its ODT device turned off in the unterminated mode, there is very little or no consumption of DC power. But the voltage swing is then equal to the source voltage of the pull-up device (550 mv to 888 mv as just described). The AC power is proportional to the square of the voltage swing such that the AC power consumption in the unterminated mode is approximately four times what the AC power consumption is in the terminated mode.

There is thus a need in the art for improved unterminated modes for memory interfaces.

SUMMARY

Memory interfaces with adjustable operating voltages are disclosed. In one example, a transmit and receive memory interface has an adjustable power supply and a selectable on-die termination resistance. The memory interface is coupled to a data transmission line and another transmit and receive memory interface that also has an adjustable power supply and a selectable on-die termination. Either one of the memory interfaces may be used for transmitting or receiving and may be used in a terminated or unterminated mode. The memory interface that is transmitting may adjust its voltage according to whether it is in a terminated or unterminated data transmission mode.

In one embodiment, a memory interface includes a pull-up device and a pull-down device, wherein the pull-up device couples between a power rail and a data line, and wherein the pull-down device couples between the data line and ground. The memory interface also includes a power supply configured to supply a first power supply voltage to the power rail during a terminated data transmission mode in which a receiving memory interface coupled to the data line has an active on-die termination. The power supply is further configured to supply a second power supply voltage to the power rail during an unterminated data transmission mode in which the on-die termination does not load the data line, the second power supply voltage being less than the first power supply voltage.

In another embodiment, a method includes transmitting a data signal at a transmitting data interface that is in communication with a transmission channel and a receiving data interface. The receiving data interface has an on-die termination resistance that is configured to be turned on for a first data transmission mode and turned off for a second data transmission mode. The method further includes changing from the first data transmission mode to the second data transmission mode, including changing a speed at which the data signal is transmitted, and in response to changing from the first data transmission mode to the second data transmission mode, adjusting an operating voltage of the transmitting data interface.

In yet another embodiment, a memory interface includes means for transmitting a binary one and means for transmitting a binary zero, wherein the means for transmitting the binary one couples between a power rail and a data line, and wherein the means for transmitting a binary zero couples between the data line and ground. The memory interface also includes means for applying a first power supply voltage to the power rail during a terminated data transmission mode in which a receiving memory interface coupled to the data line has an active on-die termination, and for applying a second power supply voltage to the power rail during an unterminated data transmission mode in which the on-die termination does not load the data line. The second power supply voltage is less than the first power supply voltage.

In yet another embodiment, a memory interface circuit includes a first transmit and receive data interface that is in communication with a second transmit and receive data interface over a transmission channel, wherein the second transmit and receive data interface includes a selectable on-die termination resistance configured to be turned on in a first data transmission mode and turned off in a second data transmission mode. The memory interface circuit also includes a power supply in communication with the first transmit and receive data interface and configured to apply a first voltage level for the first data transmission mode and to apply a second voltage level for the second data transmission mode, where the second voltage level is lower than the first voltage level.

DETAILED DESCRIPTION

Disclosed herein are embodiments of a memory interface that includes an adjustable power supply and an on-die termination component. To reduce the AC power consumption in a memory interface, the VDDQ supply voltage as discussed above is no longer maintained constant across the terminated and unterminated modes. Instead, the power supply controlling the VDDQ rail is configured to lower the VDDQ supply voltage when the unterminated mode is active and to use a higher level (e.g., the conventional 1.1V) when the terminated mode is active. For example, the power supply may include either a linear dropout regulator (LDO) or a switching power supply that is configured to respond to an indication that the unterminated mode is active by dropping the VDDQ level. As discussed above, the terminated mode (a.k.a. the terminated data transmission mode) commonly refers to a data transmission mode in which an ODT device (e.g., a transistor) is turned on at the receiving side, whereas the unterminated mode (a.k.a. the unterminated data transmission mode) commonly refers to a data transmission mode in which the ODT device is turned off at the receiving side.

In one aspect of the disclosure, VDDQ during the unterminated mode may be one-half the level used for VDDQ during the terminated mode. For example, if VDDQ equals approximately 1.1V during the terminated mode, it may be dropped to a level such that the voltage swing is still approximately 350 mV during the unterminated mode. In another implementation, VDDQ may be dropped from 1.1V to approximately 888 mV when switching from the terminated mode to the unterminated mode. The scope of embodiments is not limited to any particular voltage level for VDDQ at the power rail or VSSQ, as other voltage levels or values may be adopted as appropriate in alternate implementations; the scope of embodiments is also not limited to any particular value for voltage swing. In fact, the voltage values provided herein are for illustration only, and it is understood that various embodiments may use any appropriate voltage, whether lower or higher than those example values mentioned in this disclosure.

Figure 1:
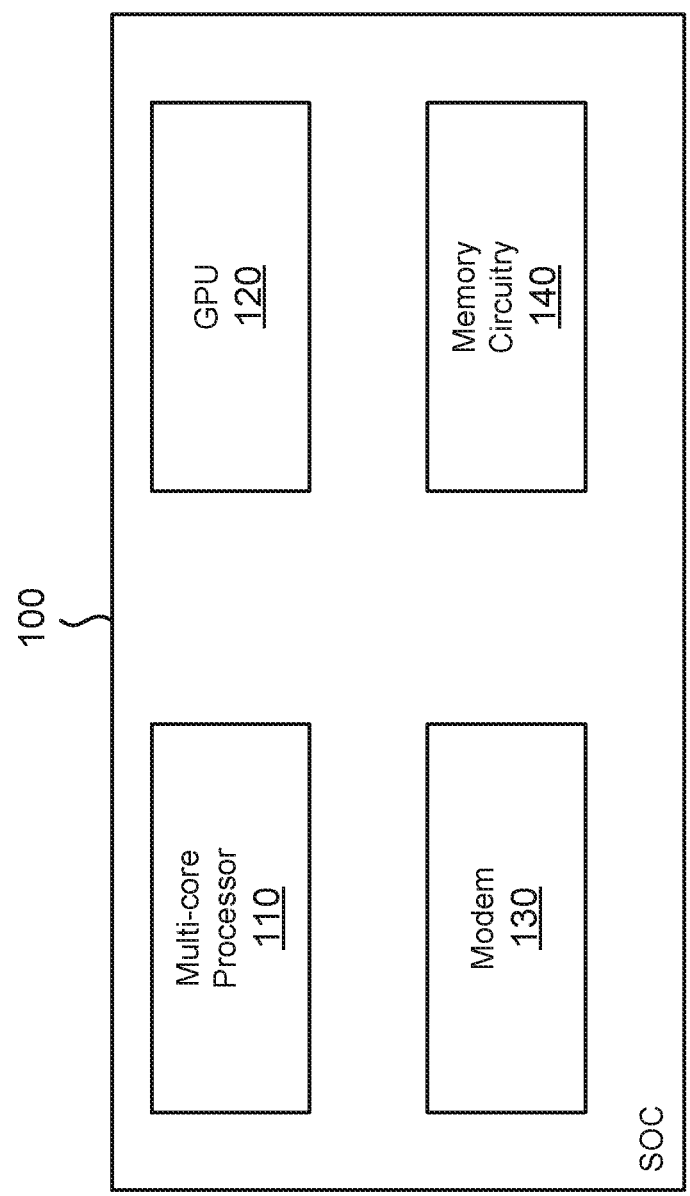
FIG. 1 is an architectural diagram illustrating an example SoC die and corresponding architecture in accordance with an embodiment of the disclosure.

FIG. 1 is an architectural diagram illustrating an example system-on-chip (SOC) 100 die and corresponding architecture. In an embodiment, the SoC die 100 is used in a smartphone, a tablet computer, or other mobile wireless device. The SoC die 100 includes a number of functional blocks, including a multi-core processor 110 (sometimes referred to as a central processing unit or CPU), a graphics processor 120, a modem 130, and a memory circuitry 140 as shown in FIG. 1. FIG. 1 is a logical layout of an SoC die 100 that shows each of the areas 110-140 for the noted functions as separate and distinct areas, but the actual physical layout may be more complex with, for example, circuitry of one functional block interspersed among circuitry for another functional block.

In an embodiment, the modem 130 implements baseband processing for any of a number of known wireless technologies or standards, such as long term evolution (LTE). The processors 110-130 refer to areas of the SoC die 100 devoted to those functional blocks. In each of these areas, there is circuitry for the designated function. The memory circuitry 140 may refer to an area of the SoC die 100 devoted to memory controller and interface circuits for interfacing to an external memory. The external memory may, for example, be housed in a package with interfaces for connecting to the memory circuitry 140. The memory circuitry 140 can be configured to interface with any type of memory, such as a DDR SDRAM, DRAM, or flash memory. For the purposes of illustration this disclosure focuses on DDR SDRAM, such as LPDDR3 and LPDDR4, but the scope of embodiments is not limited to any particular memory technology or standard. At least one of multi-core processor 110, graphics processor 120, and modem 130 is in communication with memory circuitry 140. The various components 110-140 may communicate via any form of known connection, such as a bus.

Memory circuitry 140 includes a multitude of interfaces that transmit and receive data to and from one or more memory chips. Such a relationship is shown in more detail with respect to FIG. 2, which shows multiple data transmission lines between an SOC and a memory chip. As noted above, each memory interface may include a termination component that may be turned on and off as well as an adjustable power supply that is configured to change a voltage level as the interface changes from terminated to unterminated and vice versa. The scope of embodiments is not limited to any particular SoC architecture, nor even to a multi-core system, and SoC 100 is shown as an example. In fact, various embodiments may be adapted for any type of interface between a processing circuit and a memory circuit.

Figure 2:
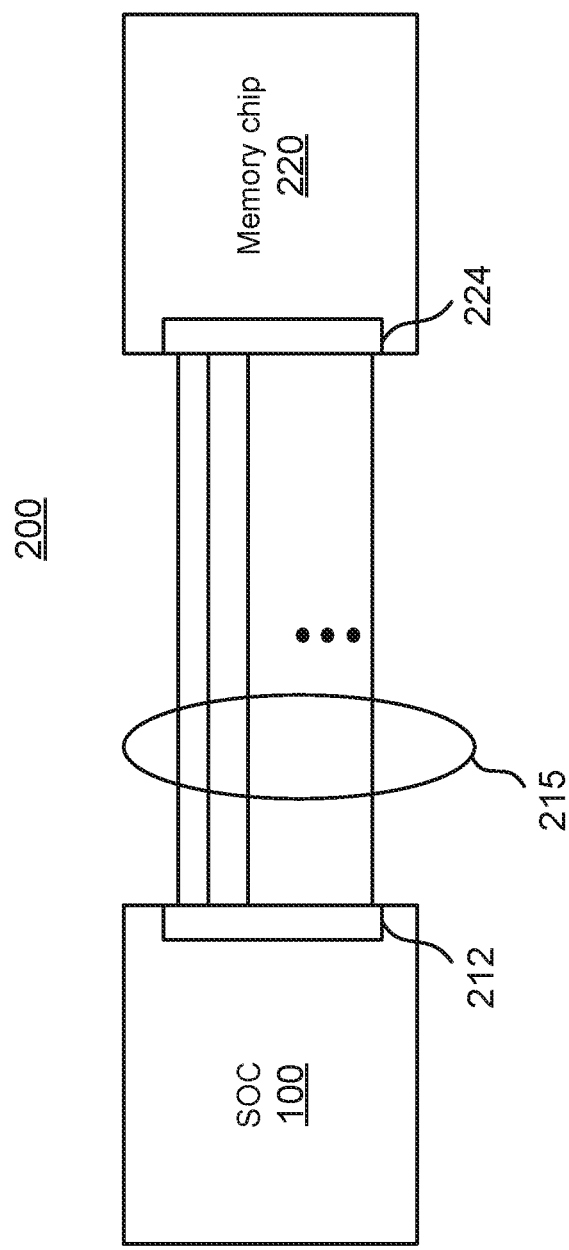
FIG. 2 illustrates an example processing chip in communication with a memory chip using multiple interfaces in accordance with an embodiment of the disclosure.

FIG. 2 is an illustration of an example application of the SoC 100 of FIG. 1, according to one embodiment. FIG. 2 illustrates a system 200 in which SoC 100 is in communication with a memory chip 220. SoC 100 communicates with memory chip 220 over transmission channels 215.

Memory chip 220 in this example includes any appropriate memory chip for use in a computing device with SoC 100. Examples include a DDR SDRAM chip. A Static Random Access Memory (SRAM) chip, a Dynamic Random Access Memory (DRAM) chip, and an electrically erasable programmable read-only memory (Flash memory) chip, although the scope of embodiments is not limited to any particular memory chip. During a write operation, memory chip 220 receives data from SoC 100 over transmission channels (data lines) 215, and a memory controller at memory chip 220 then stores that data in memory cells of the memory chip. During a read operation, memory chip 220 receives a read request for specific data from SoC 100, and the memory controller of memory chip 220 then accesses the data from various memory cells of the memory chip and transmits those bits of data to the SoC 100 over transmission channels 215.

Figure 3:
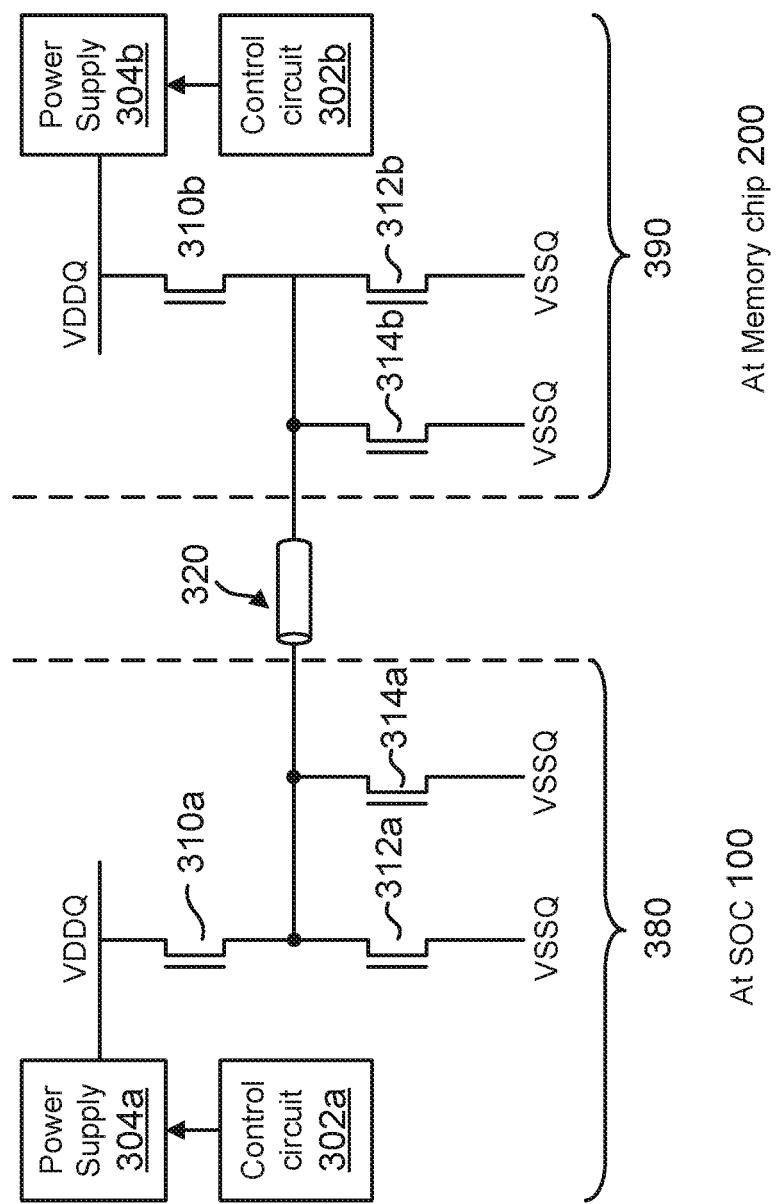
FIG. 3 illustrates an example system including an interface circuit at a processing chip in an interface circuit at a memory chip connected by a transmission channel for data in accordance with an embodiment of the disclosure.

The system of FIG. 2 may include implementations of the systems shown in FIGS. 1 and 3. In one example, system 200 of FIG. 2 is operated according to one or more DDR standards, where memory chip 220 is a DDR SDRAM chip. Memory chip 220 includes a multitude of interface circuits configured to transmit and receive data over respective transmission channels 215. It is expected that there would be many interface circuits at memory chip 220, so the interface circuits are shown collectively as TX/RX circuits 224. Each one of the interface circuits operates as described below with respect to FIG. 3, including having an adjustable power source and a selectable termination impedance. Each one of the individual transmission channels 215 are the same as or similar to transmission channel 320 of FIG. 3, including having a characteristic impedance.

Similarly, SoC 100 also has a multitude of interface circuits configured to transmit and receive data over respective transmission channels 215. Interface circuits of SOC 100 are shown collectively in this example as TX/RX 212. Each one of the interface circuits operates as described below with respect to FIG. 3, including having an adjustable power source and a selectable termination impedance. Memory circuitry 140 of FIG. 1 includes TX/RX circuits 212.

FIG. 3 is an illustration of an interface circuit of an SoC coupled to an interface circuit of a memory chip, according to one embodiment.

The left side of FIG. 3 is an illustration of interface circuit 380 implemented on SOC 100, and in this example represents one of the interface circuits at TX/RX circuits 212 FIG. 2. The right side of FIG. 3 is an illustration of an interface circuit 390 implemented on memory chip 220, and in this example represents one of the interface circuits at TX/RX circuits 224. The interface circuits 380, 390 are coupled by a transmission channel 320, which corresponds to one of the transmission channels 215 of FIG. 2.

Transmission channel 320 provides a data link between SoC 100 and memory chip 220. Transmission channel 320 may be embodied in any appropriate structure, for example, a cable, a metal trace on a printed circuit board, a metal wire connecting chips in a package, vias and metal traces connecting an SoC package to a memory chip package, and the like. In FIG. 3, transmission channel 320 is shown as a transmission line in order to emphasize its similarities with transmission lines in general, including having a characteristic impedance as well as a Resistance-Capacitance (RC) time constant. In this example embodiment, the impedance introduced by termination mode operates to match an impedance of an interface circuit to the characteristic impedance of transmission channel 320.

Referring to interface circuit 380, pull-up device 310a is shown as an NFET, as are pull-down device 312a and on-die termination device 314a. Power supply 304a provides a voltage source for VDDQ. Power supply 304a is configured to be adjustable so that it can provide at least two voltage levels, as described further below. Control circuit 302a provides a control signal to the power supply 304a to direct power supply 304a to apply a first voltage level during a terminated mode and a second voltage level in an unterminated mode.

Interface circuit 390 is configured similarly to interface circuit 380. Specifically, pull-up device 310b, pull-down device 312b, and on-die termination device 314b are shown in this example as NFET devices. Power supply 304b is an adjustable voltage source that receives a control signal from control circuit 302b. Control circuit 302b provides the control signal to a power supply 304b to direct power supply 304b to apply the first voltage level during the terminated mode and a second voltage level in the unterminated mode.

Although not shown in FIG. 3, control circuits 302a and 302b may be in electrical communication so that they can coordinate terminated and unterminated modes. For instance, in an example where control circuit 302a determines that it should change from a terminated mode to an unterminated mode (or vice versa), control circuit 302a may send a control signal to control circuit 302b informing control circuit 302b of the appropriate terminated or unterminated mode.

Furthermore, each of interface circuit 380 and interface circuit 390 are configured to be operated in both a transmit and a receive mode. Therefore, control circuit 302b is also configured to determine whether a terminated or unterminated mode is appropriate and to send control signals to control circuit 302a to coordinate operation.

As noted above, interface circuit 380 is illustrative of one of a multitude of interface circuits at SoC 100, and interface circuit 390 is illustrative of one of a multitude of interface circuits at memory chip 220. In some embodiments, control circuit 302a and power supply 304a may serve more than one interface circuit at SoC 100, and control circuit 302b and power supply 304b may serve more than one interface circuit at memory chip 220. Or put another way, in some embodiments, the various interface circuits at SoC 100 may share the same VDDQ and VSSQ power and ground rails, and the various interface circuits at memory chip 220 may share the same VDDQ and VSSQ power and ground rails.

FIG. 3 shows devices 310, 312, and 314 as NFET devices, although the scope of embodiments is not so limited. Rather, other embodiments may use a combination of p-type devices and n-type devices (such as a complementary metal oxide semiconductor or CMOS embodiment), just p-type devices, or any other appropriate device operable to act as a switch. Power supplies 304 may include any appropriate power supply, such as a switched mode power supply (SMPS), a linear dropout (LDO) voltage regulator, or the like.

Control circuits 302, as noted above, provide control signals to power supplies 304. The logic that is used to determine whether to operate in a terminated mode or an unterminated mode and to provide appropriate control signals in furtherance of the selected mode may be implemented in hardware, software, or a combination of hardware and software. Such logic may be provided as machineexecutable code stored in a tangible medium, such as RAM on the SoC 100 or memory chip 220.

In one example use case, interface circuit 380 is acting as a transmitter to transmit data bits via transmission channel 320 to interface circuit 390 at memory chip 220. Control circuits 302 would therefore communicate to coordinate that interface circuit 380 is operating in a transmit mode and to coordinate either a terminated mode or an unterminated mode of operation. For purposes of this example, it is assumed that interface circuits 380, 390 start in a terminated mode. Accordingly, on-die termination device 314*b* is turned on (device 314*a* is off).

Power supply 304*a* operates at a first voltage level, which is a higher voltage level relative to the second voltage level that is used during an unterminated mode. For example, the first voltage level for VDDQ may be 1.1 V or other appropriate level. When the signal being transferred is a binary one (high signal), pull-up device 310*a* is on (pull-down device 312*a* is off), and devices 310*a* and 314*b* act as a voltage divider, and the voltage seen at the receive side is around 350 mV, taking into account the threshold voltage of device 310*a* as a voltage drop on the source voltage. When the signal being transferred is a binary zero (low signal), pull-down device 312*a* is on (device 310*a* is off), and the voltage seen at the receive side is around 0 V. Thus, in terminated mode, the voltage swing seen at the receive node is approximately 350 mV.

In some LPDDR4 embodiments, terminated mode is appropriate for high-speed data transfer (e.g., in the range of GHz), whereas unterminated mode is more appropriate for low speed data transfer (e.g., in the range of 100 s of MHz). Therefore, when SOC 100 determines that it is going to switch to a low speed data transfer, it informs control circuits 302*a* and 302*b*, which send control signals to the respective power supplies 304*a* and 304*b* to lower the voltage level of VDDQ. The interface circuits 380, 390 switch to an unterminated mode, where both termination devices 314*a* and 314*b* are off. When the signal being transferred is a binary one (high signal), pull-up device 310*a* is on, but the voltage is not divided by terminating resistance and is sensed at the receive side as VDDQ minus the threshold voltage of pull-up device 310*a*. In the present embodiment, it may be desired that the voltage swing in the unterminated mode be approximately 350 mV, and if the threshold voltage for pull-up device 310*a* is approximately 150 mV, the voltage applied by power supplies 304*a* and 304*b* may be lowered to approximately 500 mV in the unterminated mode.

Continuing with the example, during the terminated mode of operation, control circuit 302*a* sends a control signal to power supply 304*a* to cause power supply 304*a* to apply the first voltage level (e.g., 1.1 V) at the power rail. During the unterminated mode of operation, control circuit 302*a* sends the control signal to the power supply 304*a* to cause power supply 304*a* to change its voltage level so that it applies the second voltage level (e.g., 500 mV or lower) at the power rail. As SoC 100 issues read and write operations to memory chip 220, the SOC 100 (and possibly memory chip 220) may from time to time switch between a terminated mode of operation and an unterminated mode of operation, thereby providing at least two different voltage levels at the power rails as appropriate to the particular termination mode.

Further in this example, interface circuit 390 may act as a transmitter, and interface circuit 380 may act as a receiver. Therefore, the actions described above with respect to interface circuit 390 apply just as well to interface circuit 380 when 380 act as a receiver. For instance, in a terminated mode of operation, power supply 304*b* applies the first voltage to the power rail as VDDQ, and termination device 314*a* is on (termination device 314*b* is off). In an unterminated mode of operation, power supply 304*b* applies the second voltage to the power rail as VDDQ, and both termination devices 314*a* and 314*b* are off.

Logic, either at control circuits 302*a* and 302*b*, or at some other appropriate place at SoC 100 or memory chip 220, determines when to switch between high-speed terminated mode and low-speed unterminated mode. Also, while FIG. 3 is directed toward describing a use case at a single set of interfaces sharing a common transmission line, it is understood that the same or similar actions occur at the interfaces that are associated with the other transmission lines for each bit of data that is communicated between SoC 100 and memory chip 220.

Various embodiments may provide one or more advantages over conventional systems. For instance, some conventional systems do switch between a terminated high-speed mode and an unterminated low-speed mode, but such conventional systems use the same voltage level as VDDQ for both modes. The terminated mode experiences DC power loss because of the use of the termination device. The unterminated mode does not have DC power loss from the termination device (because the termination device is off), but an increased voltage swing incurs AC power losses that are greater than the AC power losses in the terminated mode. In fact, AC power losses increase with the square of the voltage level, so that AC power losses may become significant as voltage swing increases.

By contrast, the embodiments described above with respect to FIGS. 1-3 change the value of the VDDQ voltage depending on the speed and the on-die termination setting. By lowering the VDDQ voltage when in the unterminated mode the output voltage will be limited to the value of VDDQ, thus saving power by keeping the AC component of the power to the same as in terminated mode. Furthermore, the NFET drivers of FIG. 3 may work well for a wide range of VDDQ voltage levels.

Figure 4:
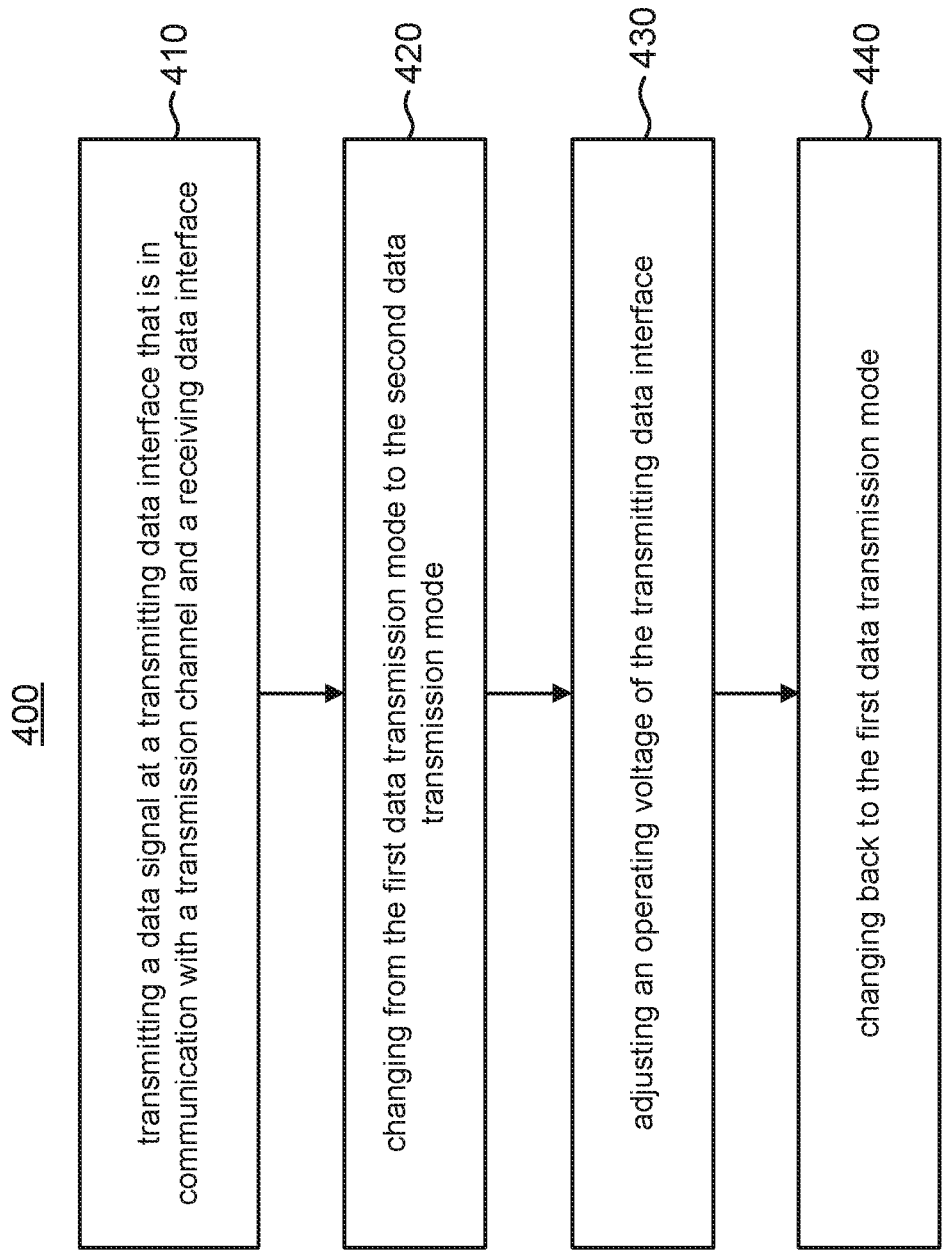
FIG. 4 illustrates an example method for changing a voltage based on a terminated or unterminated transmission mode in accordance with an embodiment of the disclosure.

A flow diagram of an example method 400 of transmitting and receiving data using the system of FIG. 3 is illustrated in FIG. 4, according to one embodiment. The method 400 begins in block 410 in which a transmitting data interface transmits a data signal to a receiving data interface over a transmission channel.

An example is shown in FIG. 3, in which data interface 380 is in transmitting mode and data interface 390 is in receiving mode. Data interface 380 transmits data bits across transmission line 320. Data interface 380 includes device 314*b* to provide a selectable on-die termination resistance. Device 314*b* can be turned on for a terminated transmission mode and turned off for an unterminated transmission mode. Assuming that the system is in a terminated mode, then the on-die termination device 314*b* is on.

Transmitting the data signal at block 410 includes applying a high-voltage or a low voltage (a binary one or a binary zero) to the transmission channel 320 to be received by the data interface 390. For instance, turning on the pull-up device 310*a* applies a binary one, whereas turning on pull-down device 312*a* (while turning off pull-up device 310*a*) applies a binary zero. Although not shown in FIG. 3, it is understood that memory chip 220 includes a component to capture the data, such as a latching receiver. Thus, action 410 may also include capturing the data signal at the receive side.

Next in block 420, the system changes from the first data transmission mode to the second data transmission mode. Continuing with the example, the system is in a terminated mode and changes to the unterminated mode, including turning off the on-die termination resistance (device 314b) so that it does not load the line and changing a speed at which the data signal is transmitted. In an example that includes LPDDR4, the terminated mode includes higher data transmission rates than does the unterminated mode. However, the scope of embodiments may include any appropriate data transmission speed for a given mode.

The determination as to whether to change from the first data transmission mode to the second data transmission mode may be made according to programmed functionality in the SOC 100 or the memory chip 220. For instance, some conventional systems employing LPDDR4 include a high-speed terminated mode and a low-speed unterminated mode, where such conventional systems include programmed algorithms to determine which mode to use. The scope of embodiments includes using any appropriate algorithms, now known or later developed, to determine to change transmission modes at block 420.

In block 430, the system adjusts an operating voltage of the transmitting data interface. In the example of FIG. 3, the power supply 304a receives a control signal from the control circuit 302a instructing it to lower the voltage it applies to the power rail. In this example, the operating voltage includes the voltage level at VDDQ, where the pull-up and pull-down devices 310a and 312a are disposed between VDDQ and VSSQ (complementary voltage or ground). At this point, interface circuits 380, 390 are operating in the low-speed, unterminated mode and at the lower, second voltage level.

Next in block 440, the system changes back to the first data transmission mode. For instance, the interface circuits 380, 390 may operate at the low-speed, unterminated mode for some amount of time until logic at either the SOC 100 or the data chip 220 determines that the high-speed, terminated operating mode is more appropriate. Accordingly, in one example, block 440 includes turning on on-die termination resistance (device 314b), and power supply 304a returns the voltage to the first voltage level in response to a control signal from control circuit 302a.

The scope of embodiments is not limited to the specific method shown in FIG. 11. Other embodiments may add, omit, rearrange, or modify one or more actions. For instance, in many real-world applications, the actions of blocks 410-440 are not performed in a strict series. For example, the data signal transmission of action 410 is performed at both data transmission modes. Furthermore, in many applications, method 400 is performed continually while a processor chip and a memory chip transmit data back and forth, and increases or decreases in activity may correspond to various processing tasks.

It is also understood that the discussion of method 400, above, applies just as well when the data chip 220 is in transmission mode (as in a read operation) and SoC 100 is in receiving mode. In such an instance, on-die termination resistance (device 314a) would be turned on during a terminated transmission mode and turned off during an unterminated transmission mode, and power supply 304b would change the operating voltage of interface circuit 390 in accordance with the particular terminated or unterminated transmission mode. Also, it is understood that in a system in which there are multiple data transmission channels (e.g., 32 or 64), method 400 would be performed at each of those transmission channels.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A memory interface circuit comprising:
   a first transmit and receive data interface that is in communication with a second transmit and receive data interface over a transmission channel, wherein the second transmit and receive data interface includes a selectable on-die termination to ground configured to be turned on in a first data transmission mode and turned off in a second data transmission mode; and
   a power supply in communication with the first transmit and receive data interface and configured to apply a first voltage level for the first data transmission mode and to apply a second voltage level for the second data transmission mode, where the second voltage level is lower than the first voltage level, and wherein a voltage swing of a single-ended transmission line at the second transmit and receive data interface is the same in both the first data transmission mode and in the second data transmission mode.

2. The memory interface circuit of claim 1, further comprising:
   another selectable on-die termination to ground included in the first transmit and receive data interface.

3. The memory interface circuit of claim 1, wherein the first transmit and receive data interface comprises:
   a pull-up transistor;
   a pull-down transistor, wherein the pull-up transistor couples between the power supply and the transmission channel, and wherein the pull-down transistor couples between the transmission channel and ground.

4. The memory interface circuit of claim 3, wherein the pull-up transistor and pull-down transistor comprise N-type field effect transistors (NFETs).

5. The memory interface circuit of claim 1, wherein the memory interface circuit is included in a system on chip (SoC).

6. The memory interface circuit of claim 1, wherein the memory interface circuit is included in a memory chip.

7. The memory interface circuit of claim 1, wherein the transmission channel includes a wire in communication between a system on chip and a memory chip.

8. A system, comprising:
   a first memory interface configured to perform transmitting and receiving;
   a second memory interface in communication with the first memory interface over a transmission line, the second memory interface configured to perform transmitting and receiving and having:
   a pull-up device;
   a pull-down device, wherein the pull-up device couples between a power rail and the transmission line, and wherein the pull-down device couples between the transmission line and ground; and
   a power supply configured to supply a first power supply voltage to the power rail during a terminated data transmission mode in which the first memory interface coupled to the transmission line has an on-die termination to ground, wherein the on-die termination is coupled to the second memory interface over the transmission line, and wherein the power supply is further configured to supply a second power supply voltage to the power rail during an unterminated data transmission mode in which the on-die termination does not load the transmission line, the second power supply voltage being less than the first power supply voltage and so that a single-ended voltage swing of the transmission line at the first memory interface is the same in both the unterminated data transmission mode and in the terminated data transmission mode.

9. The system of claim 8, wherein the first memory interface comprises a Dynamic Random Access Memory (DRAM) interface.

10. The system of claim 9, wherein the DRAM interface comprises a Low-Power $4^{th}$ generation Double Data Rate (LPDDR4) DRAM interface.

11. The system of claim 8, wherein the power supply comprises a linear dropout voltage regulator.

12. The system of claim 8, wherein the power supply comprises a switched mode power supply.

13. The system of claim 8, wherein the pull-up device and pull-down device comprise N-type field effect transistors (NFETs).

14. The system of claim 8, wherein the on-die termination matches a characteristic impedance of the transmission line.

15. The system of claim 8, wherein the first memory interface is included in a system on chip (SoC).

16. A method comprising:
    transmitting a data signal at a transmitting data interface that is in communication with a transmission channel and a receiving data interface, the receiving data interface having an on-die termination to ground that is configured to be turned on for a first data transmission mode and turned off for a second data transmission mode;
    changing from the first data transmission mode to the second data transmission mode, including changing a speed at which the data signal is transmitted; and
    in response to changing from the first data transmission mode to the second data transmission mode, adjusting an operating voltage of the transmitting data interface so that a voltage swing of a single-ended transmission line at the receiving data interface is the same in both the first data transmission mode and in the second data transmission mode.

17. The method of claim 16, further comprising:
    providing a control signal to a power supply of the transmitting data interface to adjust the operating voltage.

18. The method of claim 16, wherein changing the speed at which the data signal is transmitted comprises:
    reducing the speed at which the data signal is transmitted.

19. The method of claim 16, further comprising:
    capturing bits of the data signal using a latching receiver at the receiving data interface.

20. The method of claim 16, wherein the transmitting data interface comprises a Low-Power $4^{th}$ generation Double Data Rate (LPDDR4) Dynamic Random Access Memory (DRAM) interface.

* * * * *

UNITED STATES PATENT AND TRADEMARK OFFICE
CERTIFICATE OF CORRECTION

PATENT NO.         : 10,613,613 B2
APPLICATION NO.    : 15/863155
DATED              : April 7, 2020
INVENTOR(S)        : Michael Brunolli et al.

It is certified that error appears in the above-identified patent and that said Letters Patent is hereby corrected as shown below:

In the Specification

In the Detailed Description, Column 9, Line 42:
Replace "FIG. 11" with "FIG. 4"

Signed and Sealed this
Nineteenth Day of April, 2022

Katherine Kelly Vidal
*Director of the United States Patent and Trademark Office*